United States Patent
Tain et al.

(10) Patent No.: US 8,288,655 B2
(45) Date of Patent: Oct. 16, 2012

(54) CIRCUIT BOARD STRUCTURE AND MANUFACTURING METHOD THEREOF

(75) Inventors: Ra-Min Tain, Taipei County (TW); Ming-Ji Dai, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 607 days.

(21) Appl. No.: 12/258,453

(22) Filed: Oct. 27, 2008

(65) Prior Publication Data

US 2010/0051328 A1   Mar. 4, 2010

(30) Foreign Application Priority Data

Aug. 29, 2008  (TW) .............................. 97133281 A

(51) Int. Cl.
| H05K 1/03 | (2006.01) |
| H05K 1/09 | (2006.01) |
| H05K 1/00 | (2006.01) |
| H05K 7/20 | (2006.01) |

(52) U.S. Cl. ........ 174/256; 174/255; 174/257; 174/258; 361/705

(58) Field of Classification Search ............... 174/252, 174/255–258; 428/901; 216/41; 977/722; 361/705
See application file for complete search history.

(56) References Cited

U.S. PATENT DOCUMENTS

| 4,791,239 | A | * | 12/1988 | Shirahata et al. ............. 174/258 |
| 5,387,459 | A | * | 2/1995 | Hung .............................. 428/209 |
| 5,499,601 | A | * | 3/1996 | Imai et al. ......................... 117/84 |
| 6,028,750 | A | * | 2/2000 | Ohtsubo ................... 360/125.39 |
| 6,039,641 | A | * | 3/2000 | Sung .................................. 451/540 |
| 6,258,237 | B1 | * | 7/2001 | Gal-Or et al. ................... 204/548 |
| 6,264,882 | B1 | * | 7/2001 | Colella et al. ................... 264/643 |
| 6,391,828 | B1 | * | 5/2002 | Nies ................................. 505/237 |
| 7,134,430 | B2 | * | 11/2006 | Kim et al. ......................... 125/22 |
| 2003/0042226 | A1 | * | 3/2003 | Coll et al. ......................... 216/41 |
| 2004/0018394 | A1 | * | 1/2004 | Jia et al. ............................ 428/701 |
| 2004/0070070 | A1 | * | 4/2004 | Sung .............................. 257/706 |
| 2006/0113546 | A1 | * | 6/2006 | Sung ................................ 257/77 |

(Continued)

FOREIGN PATENT DOCUMENTS

CN   1768420   5/2006

(Continued)

OTHER PUBLICATIONS

"Second Office Action of China Counterpart Application", issued on Mar. 30, 2011, p. 1-p. 6, in which the listed references were cited.

(Continued)

*Primary Examiner* — Timothy Thompson
*Assistant Examiner* — Sherman Ng
(74) *Attorney, Agent, or Firm* — Jianq Chyun IP Office

(57) ABSTRACT

A circuit board structure and a manufacturing method thereof are provided. The circuit board structure includes a composite substrate, a dielectric layer, and a circuit layer. The composite substrate includes a metal substrate doped with non-metal powders and a metal buffer layer. A surface of the metal buffer layer opposite to the other surface of the metal buffer layer in contact with the metal substrate is treated by a polishing process. The dielectric layer is formed on the polished surface of the metal buffer layer, and the circuit layer is formed on the dielectric layer. Alternatively, a barrier layer is interposed between the dielectric layer and the metal buffer layer for preventing a diffusion effect of the metal buffer layer.

20 Claims, 4 Drawing Sheets

U.S. PATENT DOCUMENTS

| | | | |
|---|---|---|---|
| 2006/0147631 A1* | 7/2006 | Lev et al. | 427/290 |
| 2006/0186556 A1* | 8/2006 | Sung | 257/798 |
| 2007/0004165 A1* | 1/2007 | Shin et al. | 438/393 |
| 2007/0096304 A1* | 5/2007 | Kabir | 257/734 |
| 2008/0001284 A1* | 1/2008 | Yuen et al. | 257/712 |
| 2008/0019098 A1 | 1/2008 | Sung | |
| 2008/0157632 A1* | 7/2008 | Williams | 310/364 |

FOREIGN PATENT DOCUMENTS

| | | |
|---|---|---|
| CN | 101052276 | 10/2007 |
| TW | 200512902 | 4/2005 |
| TW | M282455 | 12/2005 |
| TW | M284073 | 12/2005 |
| TW | I258333 | 7/2006 |

OTHER PUBLICATIONS

"Office Action of Taiwan counterpart application" issued on Jul. 25, 2012, p1-p11, in which the listed references were cited.

* cited by examiner

CIRCUIT BOARD STRUCTURE AND MANUFACTURING METHOD THEREOF

CROSS-REFERENCE TO RELATED APPLICATION

This application claims the priority benefit of Taiwan application serial no. 97133281, filed on Aug. 29, 2008. The entirety of the above-mentioned patent application is hereby incorporated by reference herein and made a part of specification.

BACKGROUND OF THE INVENTION

1. Field of the Invention

The present invention generally relates to a circuit board structure, in particular, to a circuit board structure with heat dissipation effect.

2. Description of Related Art

Recently, with the rapid development of technology, it has an increasingly high requirement on the heat dissipation effect of metal circuit boards of electronic devices. Taking a light emitting diode (LED) for example, the illuminating efficiency of the LED has been gradually enhanced after continuous research and improvement, such that its luminance is further raised to meet more demands from various products. In other words, in order to enhance the luminance of the LED, besides solving the external packaging problem, the LED is also designed to achieve a higher electric power and a higher working current, so as to produce an LED with a higher luminance. However, once the electric power and the working current are raised, the LED generates more heat and easily gets overheated, and thus, the performance of the LED may be deteriorated, and what's worse, a failure may occur.

Currently, most of the metal circuit board structures are made of aluminum, or some others are made of copper. A copper substrate is heavier than an aluminum substrate, but a thermal conductivity of the aluminum substrate is merely half of that of the copper substrate. In order to maintain the advantage of the aluminum substrate of being lighter and to compensate the feature of a lower thermal conductivity than that of the copper, a composite substrate obtained by doping diamond powders in the aluminum substrate has both of the above advantages.

Generally, in order to lay a base layer of circuits on a surface of such a composite substrate, a dielectric layer is disposed between the composite substrate and the circuits for achieving an insulating effect. For example, a dielectric layer with a thickness of only 1 μm (micrometer) to 2 μm is formed on a surface of the composite substrate, and the dielectric layer is, for example, a diamond-like carbon film (DLC film).

However, such a composite substrate is extremely hard, so the rough surface thereof is difficult to be processed or polished. Thus, compared with an ordinary metal circuit substrate, the composite substrate has a higher surface roughness, so that the insulating effect of the coated dielectric layer is weakened. For example, in the circuit board structure provided by the ROC Patent M282455, the insulating effect of the dielectric layer is deteriorated due to the impact of diffusion effects of metal atoms or roughness of the metal composite substrate. Moreover, in the heat sink provided by the ROC Patent I258333, the dielectric layer is mainly used for enhancing the heat dissipation effect, and no solutions about improving the insulating effect are proposed.

SUMMARY OF THE INVENTION

The present invention is directed to a circuit board structure and a manufacturing method thereof, suitable for enhancing an insulating effect of a dielectric layer in a circuit board structure.

As embodied and broadly described herein, a circuit board structure is provided in the present invention, which includes a composite substrate, a dielectric layer, and a circuit layer. The composite substrate includes a metal substrate doped with non-metal powders and a metal buffer layer. A surface of the metal buffer layer opposite to the other surface of the metal buffer layer in contact with the metal substrate is treated by a polishing process. The dielectric layer is formed on the polished surface of the metal buffer layer, and the circuit layer is formed on the dielectric layer.

In an embodiment of the present invention, the circuit board structure further includes a barrier layer formed between the metal buffer layer and the dielectric layer.

A manufacturing method of a circuit board structure is further provided in the present invention, which includes the following steps. First, a composite substrate is provided, which includes a metal substrate and at least one non-metal powder. The non-metal powder is doped in the metal substrate, such that the composite substrate obtains a rough surface. Next, a metal buffer layer is formed on the composite substrate, and covers the rough surface. Then, a surface of the metal buffer layer is treated with a polishing process. Afterwards, a dielectric layer is formed on the metal buffer layer. Finally, a circuit layer is formed on the dielectric layer.

In the present invention, a metal buffer layer is first formed to cover a rough surface of the composite substrate, and then a surface of the metal buffer layer is polished to effectively enhance the insulating effect of the dielectric layer. Besides, a barrier layer is formed between the dielectric layer and the metal buffer layer to prevent metal atoms of the metal buffer layer from diffusing into the dielectric layer, thereby further enhancing the insulating effect of the dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
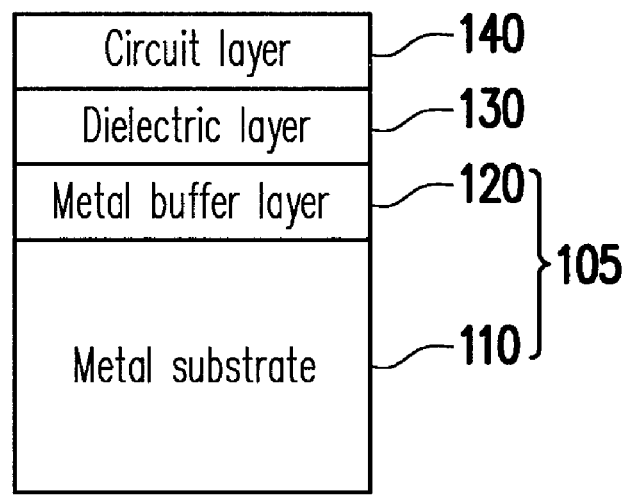
FIG. 1 shows a circuit board structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 shows a circuit board structure according to a first embodiment of the present invention. Referring to FIG. 1, a circuit board structure 100 includes a composite substrate 105, a dielectric layer 130, and a circuit layer 140. The composite substrate 105 includes a metal substrate 110 doped with non-metal powders and a metal buffer layer 120. The dielectric layer 130 is formed on an upper surface of the metal buffer layer 120, and a surface of the metal buffer layer 120 facing the dielectric layer 130 is treated with a polishing process. The circuit layer 140 is formed on an upper surface of the dielectric layer 130. That is to say, the metal substrate 110, the metal buffer layer 120, the dielectric layer 130, and the circuit layer 140 form a stacked structure.

The metal substrate 110 is made of for example, but not limited to, aluminum. The non-metal powder is a high thermal conductive material with a thermal conductivity greater than that of the metal substrate 110, so as to provide desirable heat dissipation effects. In this embodiment, the non-metal powder is, for example, a diamond powder.

The metal substrate 110 doped with non-metal powders has a rough surface, so that the metal buffer layer 120 has to be disposed between the metal substrate 110 and the dielectric layer 130. Furthermore, a surface of the metal buffer layer 120 opposite to the other surface of the metal buffer layer 120 in contact with the metal substrate 110 is treated by a polishing process. In order to make the dielectric layer 130 achieve a desired insulating effect, the metal buffer layer after being treated with a polishing process is thicker than the rough surface of the metal substrate 110 doped with non-metal powders.

In view of the above, the metal substrate 110 doped with non-metal powders has a thermal conductivity over 500 W/m° K, which is at least 1.5 times higher than the thermal conductivity of a pure-aluminum substrate of 200 W/m° K, and even higher than that of a copper substrate of 400 W/m° K for over 25%. In addition, the non-metal powder may also be a carbon nanotube, nanofiber, or a mixture of the above non-metal powders. However, the present invention is not limited thereto, and those of ordinary skill in the art may substitute the non-metal powders with other high thermal conductive materials depending upon the actual requirements.

The dielectric layer 130 is also made of a high thermal conductive material, so as to provide desirable heat dissipation effects. The dielectric layer 130 is, for example, a diamond-like carbon film (DLC film) with a thickness smaller or equal to 2.5 μm (micrometer), and in one exemplary embodiment, the thickness of the DLC film is in a range from 1 μm to 2 μm. However, the present invention is not limited thereto, and those of ordinary skill in the art may substitute the dielectric layer with other high thermal conductive materials depending upon the actual requirements.

The circuit layer 140 is coupled to a common circuit, for example, a light emitting diode (LED).

Figure 2:
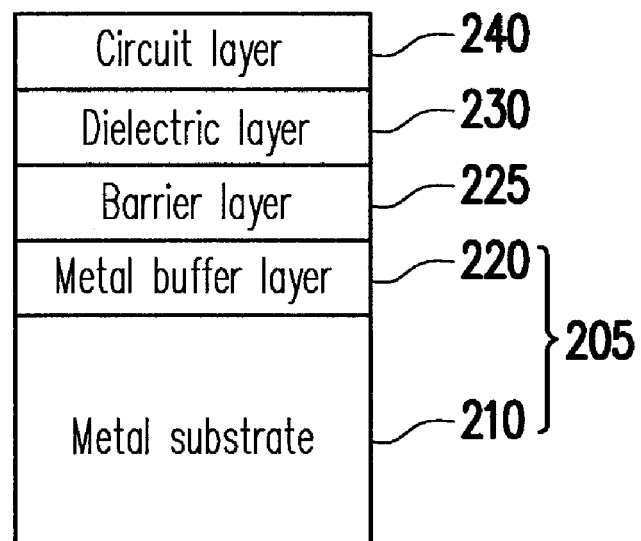
FIG. 2 shows a circuit board structure according to another embodiment of the present invention.

FIG. 2 shows a circuit board structure according to another embodiment of the present invention. Referring to FIG. 2, a circuit board structure 200 includes a composite substrate 205, a barrier layer 225, a dielectric layer 230, and a circuit layer 240. The composite substrate 205 includes a metal substrate 210 and a metal buffer layer 220. The barrier layer 225 is formed on an upper surface of the metal buffer layer 220, and a surface of the metal buffer layer 220 facing the metal barrier layer 225 is treated with a polishing process. The dielectric layer 230 is formed on the barrier layer 225, and the circuit layer 240 is formed on an upper surface of the dielectric layer 230. That is to say, the metal substrate 210, the metal buffer layer 220, the barrier layer 225, the dielectric layer 230, and the circuit layer 240 form a stacked structure.

Moreover, the metal substrate 210, the metal buffer layer 220, the dielectric layer 230, and the circuit layer 240 are made of the same materials as the metal substrate 110, the metal buffer layer 120, the dielectric layer 130, and the circuit layer 140 in the above embodiment, so the details will not be described herein again.

As the metal buffer layer 220 may easily generate a diffusion effect, for example, the copper atoms in the metal buffer layer 220 are diffused into the dielectric layer 230, so that the insulating effect of the dielectric layer 230 is deteriorated. Besides, before the next process, the polished surface of the metal buffer layer 220 may be easily oxidized, and as a result, it is difficult for the dielectric layer 230 to be attached to the metal buffer layer 220.

In order to solve the above problems, the barrier layer 225 is further plated on the surface of the metal buffer layer 220. The barrier layer 225 may be made of tantalum (Ta), tungsten (W), titanium (Ti), or an alloy thereof. Then, the dielectric layer 230 is formed on a surface of the barrier layer 225, and then, the circuit layer 240 is formed on a surface of the dielectric layer 230. As seen from the above, the dielectric layer 230 is, for example, a DLC film with a thermal conductivity over 450 W/m° K. When the barrier layer 225 is made of W, its thermal conductivity is 160 W/m° K. Thus, as the dielectric layer 230, the metal buffer layer 220, and the metal substrate 210 are all made of high thermal conductive materials, the circuit board structure 200 is highly efficient in heat dissipation.

Figure 3:
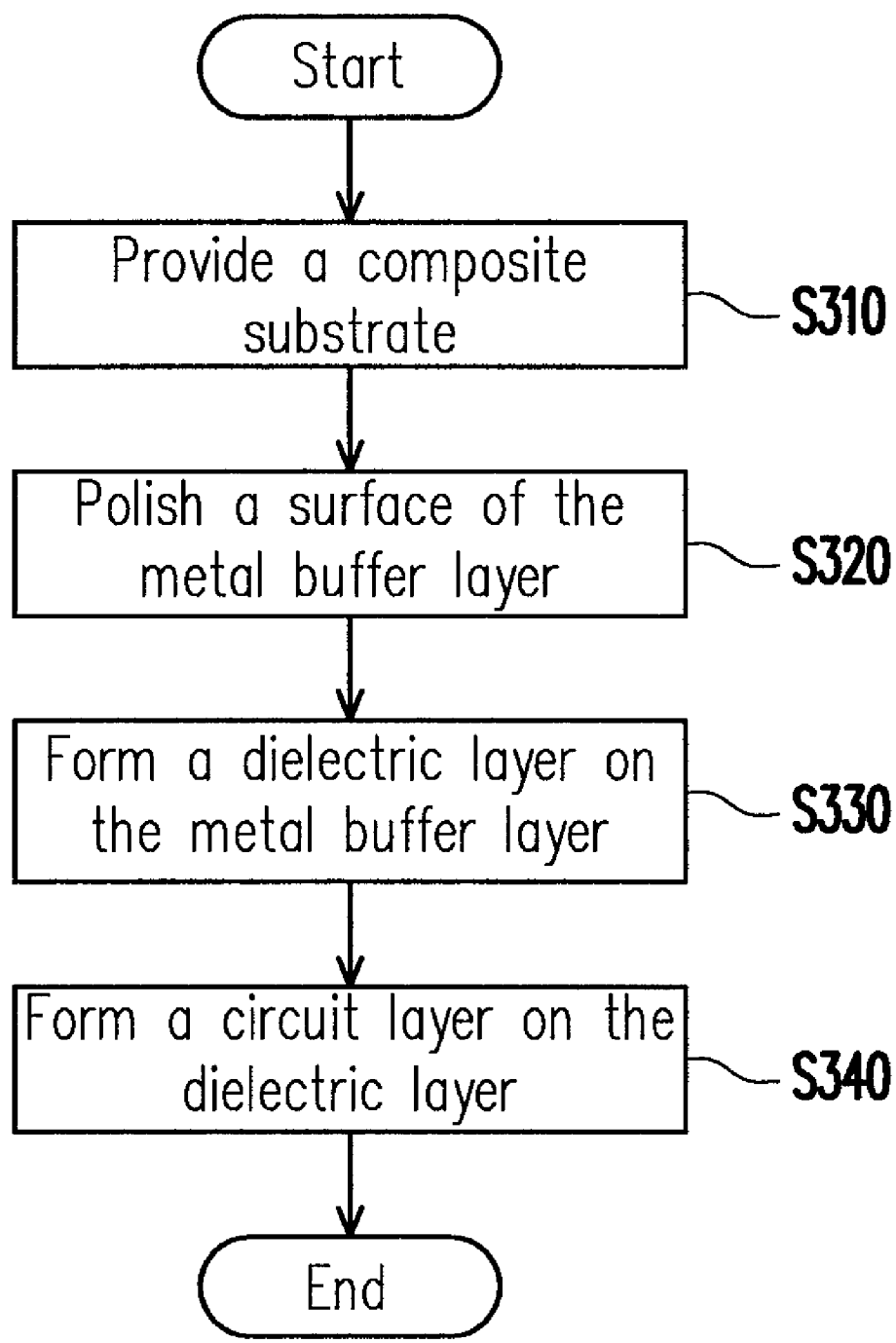
FIG. 3 is a flow chart of a manufacturing method of a circuit board structure according to an embodiment of the present invention.

In addition, a manufacturing method of a circuit board structure is also provided. The manufacturing process is not critical in the present invention, and has already been well-known to those of ordinary skill in the art, so the details thereof will not be given herein again. Only the technical key points of the present invention are illustrated below in detail. In order to enable those of ordinary skill in the art to further understand the manufacturing method of a circuit board structure provided in this embodiment of the present invention, several schematic cross-sectional views are provided as a reference for those of ordinary skill in the art. FIG. 3 is a flow chart of a manufacturing method of a circuit board structure according to an embodiment of the present invention. FIGS. 4A to 4E are schematic cross-sectional views of a manufacturing method of a circuit board structure according to an embodiment of the present invention.

Referring to FIG. 3, first, in Step S310, a composite substrate is provided, which includes a metal substrate doped with non-metal powders and a metal buffer layer. Next, in Step 320, a surface of the metal buffer layer is polished to obtain a smooth polished surface. Then, in Step S330, a dielectric layer is formed on the polished surface of the metal buffer layer, and the dielectric layer is, for example, a DLC film with a thickness smaller or equal to 2.5 μm, and in one exemplary embodiment, the thickness of the DLC film is in a range from 1 μm to 2 μm. Finally, in Step 340, a circuit layer is formed on the dielectric layer.

In another alternatively embodiment, between Step S320 and Step S330, a barrier layer is selectively formed on the metal buffer layer, such that the dielectric layer is covered on the barrier layer. In other words, the barrier layer is interposed between the dielectric layer and the metal buffer layer.

Figure 4A:
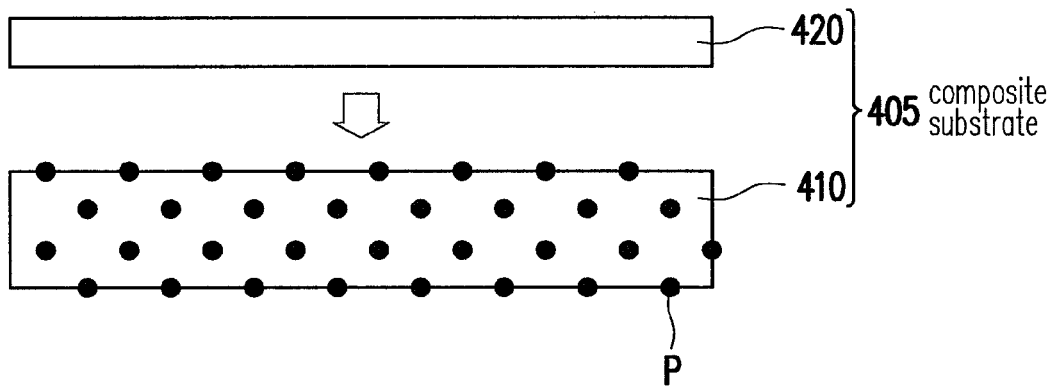
FIGS. 4A to 4E are schematic cross-sectional views of a manufacturing method of a circuit board structure according to an embodiment of the present invention.

According to the flow chart of the manufacturing method shown in FIG. 3, FIGS. 4A to 4E are schematic cross-sectional views of a manufacturing method of a circuit board structure according to an embodiment of the present invention. First, a composite substrate 405 is provided, which includes a metal substrate 410 doped with non-metal powders and a metal buffer layer 420. The process for forming the composite substrate 405 is shown in FIG. 4A, and the metal buffer layer 420 is first formed on a surface of the metal substrate 410.

As known from the prior art, the metal substrate 410 after being doped with some non-metal powders P has a higher roughness. Besides, as the doped non-metal powders P cannot be treated into smooth configurations through a common polishing process, the metal substrate 410 may obtain a rough surface. At this time, if a dielectric layer 430 is directly laid on the metal substrate 410, the experiment result proves that the dielectric layer 430 has a poor insulating effect.

Figure 4B:
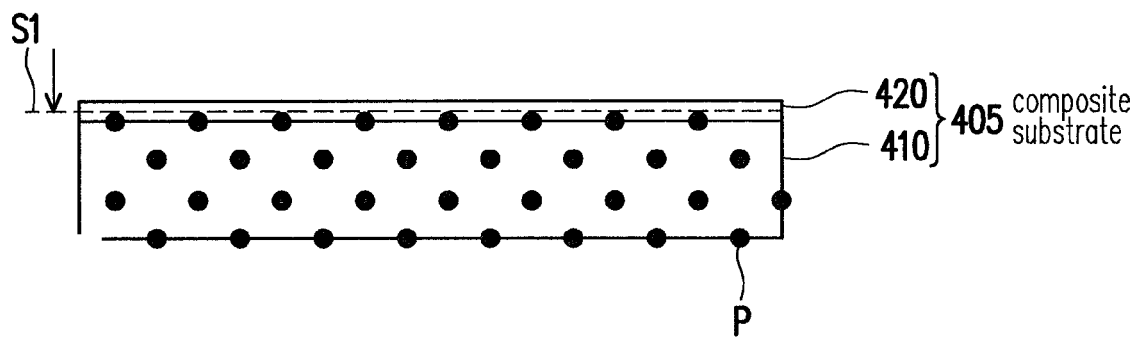

Next, referring to FIG. 4B, a surface of the metal buffer layer 420 is treated with a polishing process, so as to obtain a polished surface S1. Since a thinner metal buffer layer 420 can provide desired heat dissipation effects, the polished surface S1 is aligned with a top edge of the rough surface of the composite substrate 410.

Figure 4C:
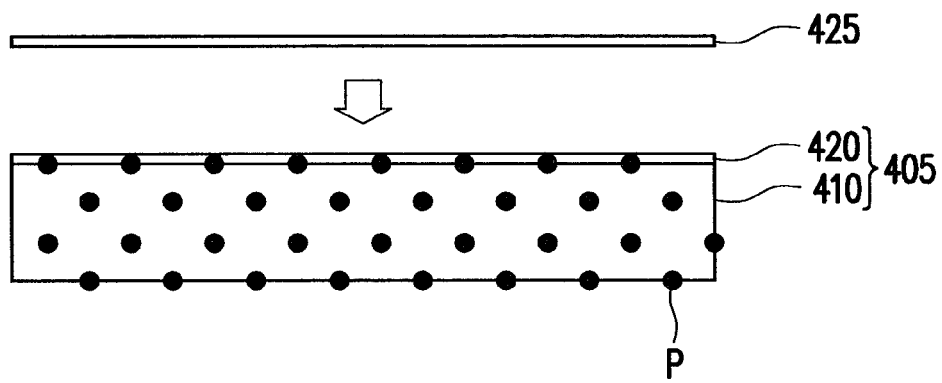

Before Step S330, a barrier layer 425 is selectively formed on the metal buffer layer 420, as shown in FIG. 4C, such that the dielectric layer 430 is covered on the barrier layer 425. In other words, the barrier layer 425 is interposed between the dielectric layer 430 and the metal buffer layer 420.

Figure 4D:
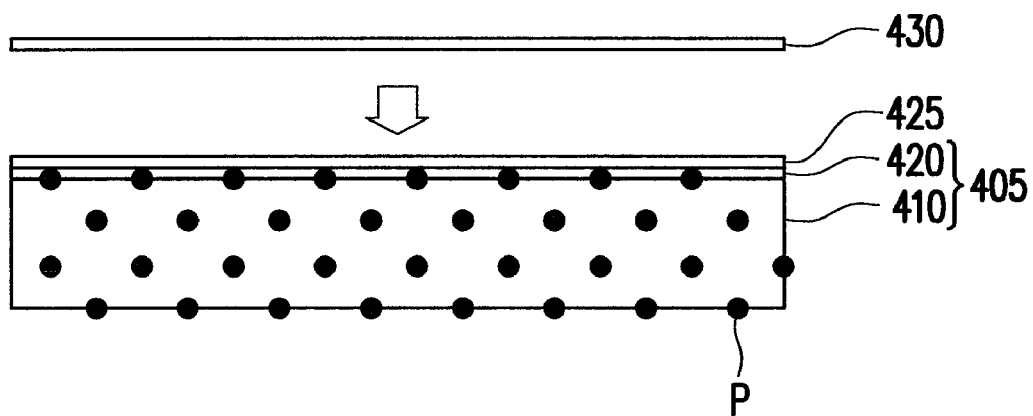
Figure 4E:
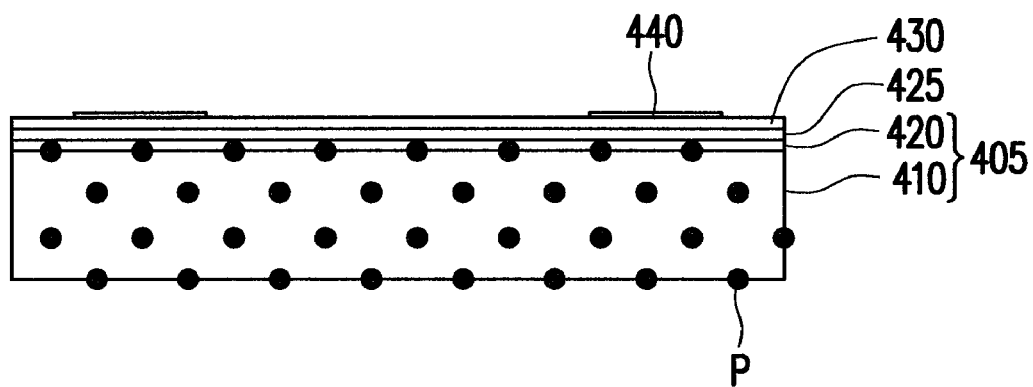

Afterwards, referring to FIG. 4D, the dielectric layer 430 is formed on the metal buffer layer 420, and the dielectric layer 430 is, for example, a DLC film with a thickness between 1 μm and 2 μm. Finally, referring to FIG. 4E, a circuit layer 440 is formed on the dielectric layer 430. The details about the materials used in the manufacturing method of this embodiment can be obtained with reference to the above embodiments, which will not be given herein again.

To sum up, the embodiments of the present invention provide a circuit board structure capable of enhancing heat dissipation effects. The circuit board structure adopts a composite material to manufacture a composite substrate. The composite substrate is mainly formed by a metal substrate doped with non-metal powders of high thermal conductive materials. The non-metal powders are in the shape of, for example, particles, wires, or fibers, and the thermal conductivity of the non-metal material is greater than that of the metal substrate. Then, a metal buffer layer is formed on the composite substrate, and the thickness of the metal buffer layer must be greater than the surface roughness of the composite substrate. After that, the composite substrate covered with the metal buffer layer is polished to improve the surface roughness of the composite substrate. Then, a dielectric layer is formed on the polished surface of the metal buffer layer, and then, after the dielectric layer has been covered on the metal buffer layer, a circuit layer is further formed on the dielectric layer.

In view of the above, the present invention solves the problem about surface roughness of the composite substrate, so as to effectively enhance the insulating effect of the dielectric layer and improve the heat dissipation performance of the circuit board structure. In addition, the barrier layer formed between the dielectric layer and the metal buffer layer may prevent metal atoms of the metal buffer layer from diffusing into the dielectric layer, thereby further enhancing the insulating effect of the dielectric layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board structure, comprising: a composite substrate, comprising a metal substrate doped with non-metal powders and a metal buffer layer, wherein a surface of the metal buffer layer opposite to the other surface of the metal buffer layer in contact with the metal substrate is treated by a polishing process, and the non-metal powders are mixed and distributed within the entire substrate; a dielectric layer, formed on the polished surface of the metal buffer layer; a circuit layer, formed on the dielectric layer, and a barrier layer formed between the metal buffer layer and the dielectric layer, wherein the barrier layer is respectively directly adjacent to the metal buffer layer and the dielectric layer; wherein the thermal conductivity of the barrier layer is lower than the thermal conductivity of the dielectric layer.

2. The circuit board structure according to claim 1, wherein the metal substrate is made of aluminum.

3. The circuit board structure according to claim 1, wherein the non-metal powder comprises a first high thermal conductive material with a thermal conductivity greater than that of the metal substrate.

4. The circuit board structure according to claim 3, wherein the first high thermal conductive material comprises a diamond powder, carbon nanotube, nanofiber, or a mixture of the above non-metal powders.

5. The circuit board structure according to claim 1, wherein the metal buffer layer is made of copper.

6. The circuit board structure according to claim 1, wherein the metal buffer layer after being treated with a polishing process is thicker than a rough surface of the metal substrate doped with the non-metal powders.

7. The circuit board structure according to claim 1, wherein the dielectric layer comprises a second high thermal conductive material.

8. The circuit board structure according to claim 7, wherein the second high thermal conductive material is a diamond-like carbon film (DLC film).

9. The circuit board structure according to claim 8, wherein a thickness of the DLC film is smaller or equal to 2.5 μm.

10. The circuit board structure according to claim 1, wherein the barrier layer is made of tantalum (Ta), tungsten (W), titanium (Ti), or an alloy thereof.

11. A manufacturing method of a circuit board structure, comprising: providing a composite substrate, wherein the composite substrate comprises a metal substrate doped with non-metal powders and a metal buffer layer, and the non-metal powders are mixed and distributed within the entire substrate; performing a polishing process on a surface of the metal buffer layer, so as to form a polished surface; forming a dielectric layer on the metal buffer layer; and forming a circuit layer on the dielectric layer; and forming a barrier layer on the metal buffer layer, wherein the barrier layer is interposed between the dielectric layer and the metal buffer layer, and the barrier layer is respectively directly adjacent to the metal buffer layer and the dielectric layer wherein the barrier layer is respectively directly adjacent to the metal buffer layer and the dielectric layer; wherein the thermal conductivity of the barrier layer is lower than the thermal conductivity of the dielectric layer.

12. The manufacturing method of a circuit board structure according to claim 11, wherein the metal substrate is made of aluminum.

13. The manufacturing method of a circuit board structure according to claim 11, wherein the non-metal powder comprises a first high thermal conductive material.

14. The manufacturing method of a circuit board structure according to claim 13, wherein the first high thermal conductive material comprises a diamond powder, carbon nanotube, nanofiber, or a mixture of the above non-metal powders.

15. The manufacturing method of a circuit board structure according to claim 11, wherein the metal buffer layer is made of copper.

16. The manufacturing method of a circuit board structure according to claim 11, wherein the dielectric layer comprises a second high thermal conductive material.

17. The manufacturing method of a circuit board structure according to claim 13, wherein the second high thermal conductive material is a diamond-like carbon film (DLC film).

18. The manufacturing method of a circuit board structure according to claim 17, wherein a thickness of the DLC film is smaller or equal to 2.5 μm.

19. The manufacturing method of a circuit board structure according to claim 11, wherein the bather layer is made of tantalum (Ta), tungsten (W), titanium (Ti), or an alloy thereof.

20. The manufacturing method of a circuit board structure according to claim 11, wherein the metal buffer layer after being treated with a polishing process is thicker than a rough surface of the metal substrate doped with the non-metal powders.

* * * * *